United States Patent
Wu et al.

(10) Patent No.: US 9,947,602 B2
(45) Date of Patent: Apr. 17, 2018

(54) IC STRUCTURE INTEGRITY SENSOR HAVING INTERDIGITATED CONDUCTIVE ELEMENTS

(71) Applicant: GLOBALFOUNDRIES Inc., Grand Cayman (KY)

(72) Inventors: Zhuojie Wu, Port Chester, NY (US); Erdem Kaltalioglu, Newburgh, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/237,066

(22) Filed: Aug. 15, 2016

(65) Prior Publication Data
US 2018/0047648 A1   Feb. 15, 2018

(51) Int. Cl.
*H01L 21/66*   (2006.01)

(52) U.S. Cl.
CPC .............. *H01L 22/34* (2013.01); *H01L 22/14* (2013.01); *H01L 22/32* (2013.01)

(58) Field of Classification Search
CPC .......... H01L 22/34; H01L 22/14; H01L 22/32
See application file for complete search history.

(56) References Cited

U.S. PATENT DOCUMENTS

| | | | |
|---|---|---|---|
| 7,098,676 B2 | 8/2006 | Landers et al. | |
| 7,812,424 B2 * | 10/2010 | Barth | H01L 23/5223 257/532 |
| 8,159,254 B2 | 4/2012 | Kaltalioglu | |

* cited by examiner

*Primary Examiner* — Douglas Menz
(74) *Attorney, Agent, or Firm* — Yuanmin Cai; Hoffman Warnick LLC

(57) ABSTRACT

A sensor for an integrated circuit (IC) structure is disclosed. The sensor includes a sensor layer in a layer of the IC structure, the sensor layer including: a first conductive structure disposed proximate a perimeter of the IC structure; and a second conductive structure disposed parallel to the first conductive structure and proximate the perimeter of the IC structure. The sensor also includes a set of interdigitating conductive elements including a first plurality of conductive elements electrically coupled to the first conductive structure interdigitating with a second plurality of conductive elements electrically coupled to the second conductive structure.

19 Claims, 6 Drawing Sheets

IC STRUCTURE INTEGRITY SENSOR HAVING INTERDIGITATED CONDUCTIVE ELEMENTS

BACKGROUND

The present disclosure relates to semiconductor fabrication, and more specifically, to a sensor for an integrated circuit (IC) structure for moisture and chip integrity monitoring having interdigitated conductive elements.

During semiconductor fabrication and during IC packaging, monitoring of chip package integrity is an important part of the process. IC chips are formed on a semiconductor wafer and separated into individual chips by cutting that can damage the chips. Any moisture or cracks/defects in an IC structure can lead to chip failures and/or performance degradation. Typically, a sensor including conductive perimeter lines (e.g., 2 perimeter lines) are provided around a periphery of a chip to monitor chip integrity. In use, the conductive perimeter lines can be used to measure changes in leakage that indicate the presence of moisture, and/or changes in resistance that indicate the presence of cracks or other physical defects. As current technology continues to scale to smaller dimensions, e.g., 22 nm and beyond, the sensor dimensions also are reduced, resulting in increased resistance thereof. With advancing minimum ground rule dimensions, the very long perimeter lines are becoming too high in resistance to be useful. To address this issue, the perimeter lines are being made wider, which also requires wider spacing that makes the measurements of leakage less sensitive.

SUMMARY

A first aspect of the disclosure is directed to a sensor for an integrated circuit (IC) structure, the sensor comprising: a sensor layer in a layer of the IC structure, the sensor layer including: a first conductive structure disposed proximate a perimeter of the IC structure; a second conductive structure disposed parallel to the first conductive structure and proximate the perimeter of the IC structure; and a set of interdigitating conductive elements including a first plurality of conductive elements electrically coupled to the first conductive structure interdigitating with a second plurality of conductive elements electrically coupled to the second conductive structure.

A second aspect of the disclosure includes a sensor for an integrated circuit (IC) structure, the sensor comprising: a sensor layer in a layer of the IC structure, the sensor layer including: a first conductive comb structure disposed proximate a perimeter of the IC structure and having a first conductive spine and a first plurality of conductive elements electrically coupled to the first conductive spine; and a second conductive comb structure disposed proximate the perimeter of the IC structure and having a second conductive spine and a second plurality of conductive elements electrically coupled to the second conductive spine, wherein the first plurality of conductive elements interdigitate with the second plurality of conductive elements.

A third aspect of the disclosure related to a sensor for an integrated circuit (IC) structure, the sensor comprising: a sensor layer in a layer of the IC structure, the sensor layer including: a first conductive structure disposed proximate a perimeter of the IC structure; a second conductive structure disposed parallel to the first conductive structure and proximate the perimeter of the IC structure; and a set of interdigitating conductive elements including a first plurality of conductive elements electrically coupled to the first conductive structure interdigitating with a second plurality of conductive elements electrically coupled to the second conductive structure, wherein the first conductive structure and the second conductive structure are each individually wider than any conductive element in the set of interdigitated conductive elements, and a spacing between adjacent interdigitated conductive elements is no greater than a width of each individual conductive element.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

A sensor for an integrated circuit (IC) structure is disclosed. The sensor can be used to monitor leakage and/or moisture in an IC structure. "IC structure" as used herein may include circuitry in or on a semiconductor and provided as a complete IC, IC chip or a partial (IC) such as a test site. The sensor includes a sensor layer in a layer of the IC structure. The sensor layer may include a first conductive structure disposed proximate a perimeter of the IC structure, and a second conductive structure disposed parallel to the first conductive structure and proximate the perimeter of the IC structure. In contrast to conventional systems, the sensor also includes a set of interdigitating conductive elements including a first plurality of conductive elements electrically coupled to the first conductive structure interdigitating with a second plurality of conductive elements electrically coupled to the second conductive structure. Each conductive structure can take the form of a conductive spine, which along with respective plurality of conductive elements electrically coupled thereto, can form a conductive comb structure.

Figure 1:
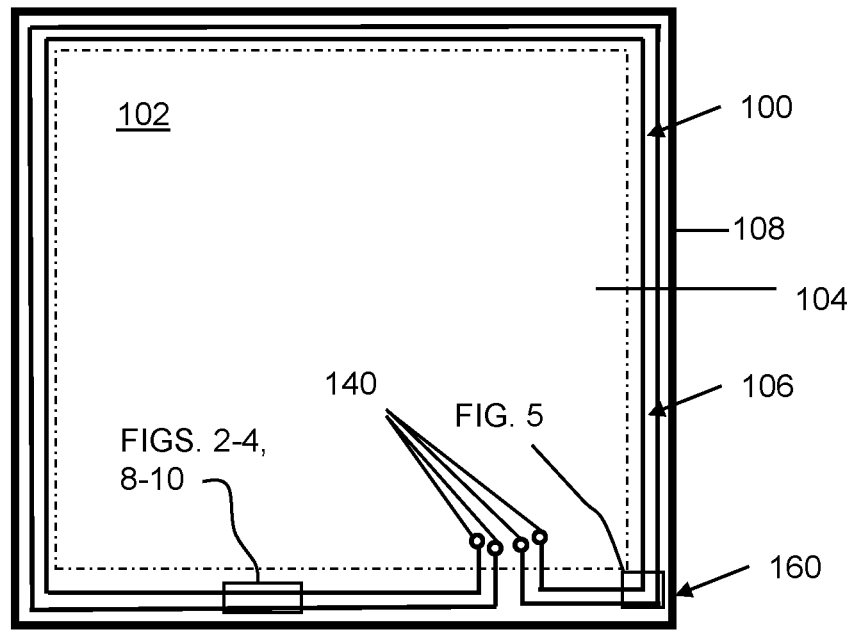
FIG. 1 shows a top view of a sensor for an IC structure according to embodiments of the disclosure.

Referring to FIG. 1, a top view of a sensor 100 for an IC structure 102 is illustrated. As understood, IC structure 102 (phantom box) includes layers 104, stacked vertically into the page of FIG. 1, that include any of a large variety of devices, e.g., transistors, resistors, capacitors, etc., and various insulating layers including conductive interconnects connecting the devices extending therethrough. FIG. 1 shows a top view of one of layers 104 of IC structure 102. Sensor 100 includes one or more sensor layer(s) 106 that each include conductive features, described herein, near a perimeter 108 of IC structure 102 in a layer(s) 104 of IC structure 102. Sensor layers 106 can be provided in a number of layers 104 of IC structure 102, and multiple sensor layers 106 may be vertically interconnected as will be described herein using vias.

Figure 2:
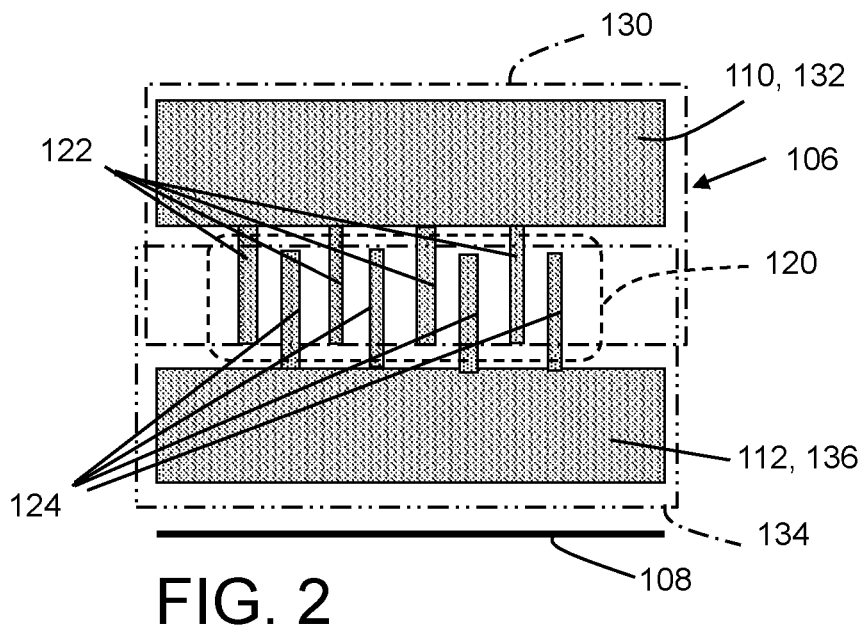
FIG. 2 shows an enlarged top view of the sensor as noted in FIG. 1 according to embodiments of the disclosure.

Referring to FIG. 2, which shows an enlarged view of a section of sensor 100 from FIG. 1, each sensor layer 106 may include a first conductive structure 110 disposed proximate perimeter 108 of IC structure 102 (FIG. 1), and a second conductive structure 112 disposed parallel to first conductive structure 110 and proximate perimeter 108 of IC structure 102 (FIG. 1). Sensor 100 also includes a set of interdigitating conductive elements 120 (within phantom box) electrically coupled to conductive structures 110, 112. Set of interdigitating conductive elements 120 may include a first plurality of conductive elements 122 electrically coupled to first conductive structure 110 interdigitating with a second plurality of conductive elements 124 electrically coupled to second conductive structure 112. As illustrated, first conductive structure 110 and first plurality of conductive elements 122 are configured in a comb arrangement, and second conductive structure 112 and second plurality of conductive elements 124 are configured in a comb arrangement. In this light, a first conductive comb structure 130 (phantom box) is disposed proximate perimeter 108 of IC structure 102 (FIG. 1) and has a first conductive spine 132 (conductive structure 110) and first plurality of conductive elements 122 electrically coupled to first conductive spine 132. Similarly, a second conductive comb structure 134 (phantom box) is disposed proximate perimeter 108 of IC structure 102 (FIG. 1) and has a second conductive spine 136 (conductive structure 112) and second plurality of conductive elements 134 electrically coupled to second conductive spine 136. First plurality of conductive elements 122 interdigitate with second plurality of conductive elements 124, i.e., they mesh like the fingers of two clasped hands (but they do not interlock).

As shown in FIG. 1, sensor 100 may also include a terminal 140 coupled to each end of first and second conductive structures 110, 112, e.g., in each sensor layer 106 at which measurement is desired. Conductive structures 110, 112, and set of interdigitating conductive elements 120 may be formed in layer(s) 104 of IC structure 102 (FIG. 1) using any now known or later developed semiconductor fabrication process appropriate for the particular dimensions of sensor layer 106, e.g., electroplating; or dielectric layer photolithographic patterning, etching, conductor deposition and planarization, etc. While terms such as "elements" and "structures" have been used herein to differentiate features of sensor 100, the features will typically include the same conductive material, e.g., copper, aluminum, etc., and depending on layer 104 of IC structure 102 (FIG. 1) in which the features are used, they may be positioned within any appropriate dielectric material of IC structure 102, e.g., silicon oxide, low-k dielectric, etc.

In the embodiments shown, first plurality of conductive elements 122 extend perpendicularly from first conductive structure 110 and second plurality of conductive elements 124 extend perpendicularly from second conductive structure 112. Although not shown, it will be appreciated that conductive elements 122, 124 may extend in parallel fashion at an angle other than perpendicular from respective conductive structures 110, 112. In any event, first conductive structure 110 (spine 132) and second conductive structure 112 (spine 134) may be each individually wider than any conductive element 122, 124 in set of interdigitated conductive elements 120. Further, as shown in the enlarged top view of FIG. 3 for clarity, in one embodiment, a spacing S between adjacent interdigitated conductive elements 122, 124 is no greater than a width W of each individual conductive element 122, 124.

Figure 3:
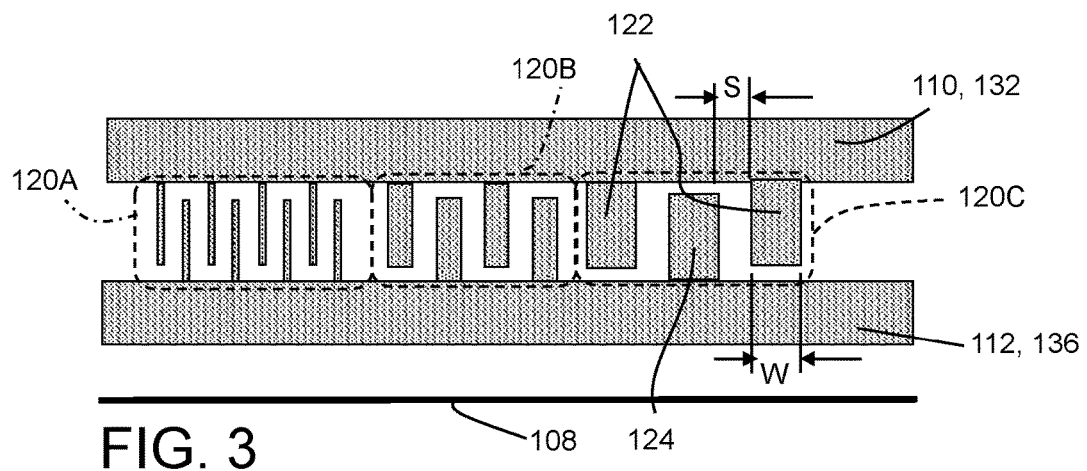
FIG. 3 shows an enlarged top view of the sensor as noted in FIG. 1 according to embodiments of the disclosure.

As shown in FIG. 3, in one embodiment, set of interdigitating conductive elements 120 (FIG. 2) may include a plurality of sets of interdigitating conductive elements 120A, 120B, 120C, etc. (shown with phantom boxes). In this example, at least two of the plurality of sets 120A, 120B, 120C of interdigitating conductive elements have at least one of: different sized conductive elements, different spacing between conductive elements and different density of conductive elements. In FIG. 3, each set 120A, 120B, 120C has different sized conductive elements, i.e., with different widths W. Each set also has different conductive element spacing S, and different density of conductive elements. Through selection of different sizes, spaces, density, etc. sets of interdigitating conductive elements 120A, B, C within a particular sensor 100, the sensor can be highly customized for a particular application.

Figure 4:
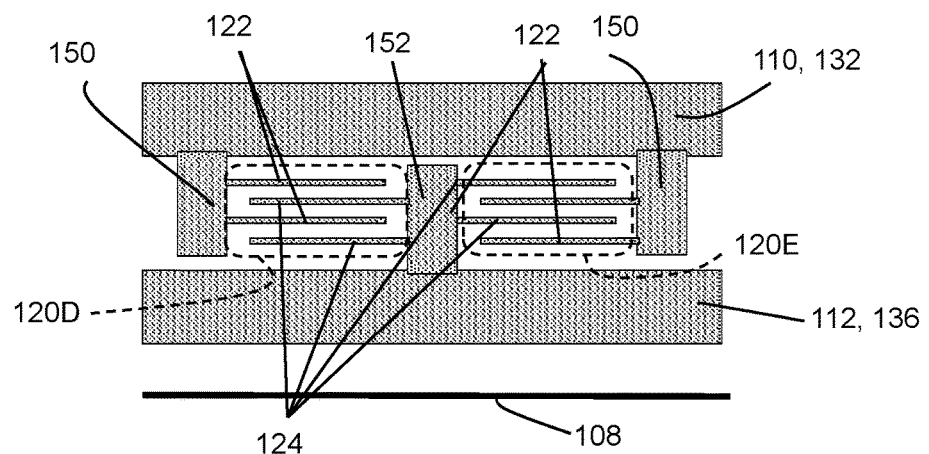
FIG. 4 shows an enlarged top view of the sensor as noted in FIG. 1 according to embodiments of the disclosure.

In FIGS. 2 and 3, conductive elements 122, 124 extend perpendicular to conductive structures 110, 112 (spines 132, 136). FIG. 4 shows an enlarged top view of sensor 100 according to another embodiment in which a first intermediate conductive member 150 extends perpendicularly from and is electrically coupled to first conductive structure 110. Here, first plurality of conductive elements 122 extend perpendicularly from first intermediate conductive structure 150 (in example, 2 shown) such that they are parallel to conductive structure 110 (spine 132). Similarly, a second intermediate conductive member 152 (in example, 1 shown) extends perpendicularly from and is electrically coupled to second conductive structure 112. And, second plurality of conductive elements 124 extends perpendicularly from second intermediate conductive structure 152 such that they are parallel to conductive structure 112 (spine 136). First and second plurality of conductive elements 122, 124 are also interdigitated. Here, two sets of interdigitated conductive elements 120D, 120E (phantom boxes) are created. Sets of interdigitating conductive elements 120D, 120E may also have different sizes, spaces, density, etc., and may be used with other sets 120A-C (FIG. 3), as described herein, to create highly customized sensors for particular applications. That is, the FIGS. 2, 3 and 4 embodiments may be used together within a single sensor layer 106 (FIG. 1) as shown in one example in FIGS. 6 and 7 (FIGS. 2 and 4 embodiments shown together).

Figure 5:
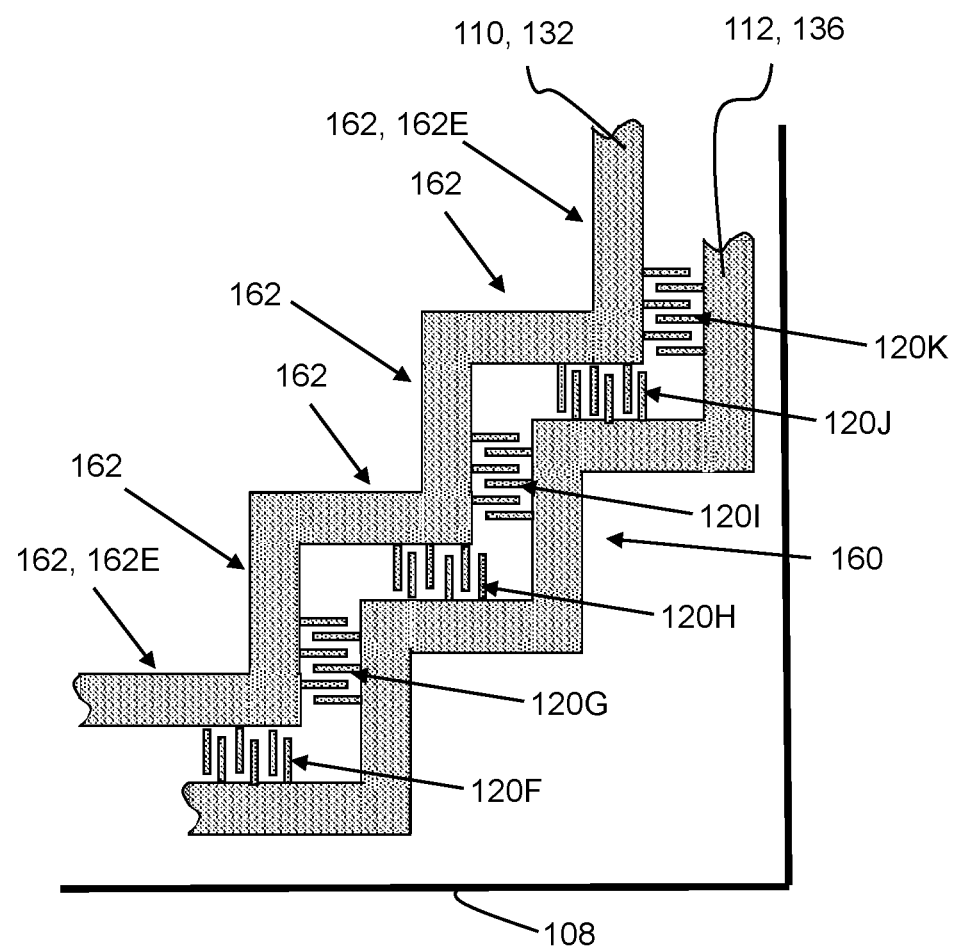
FIG. 5 shows an enlarged top view of a corner of the sensor as noted in FIG. 1 according to embodiments of the disclosure.

FIG. 5 shows an enlarged top view of a corner 160 of sensor 100 as noted in FIG. 1 according to embodiments of the disclosure. As illustrated, sets of interdigitating conductive elements 120F-K may also be applied to corner 160. Sensor 100 may include any number of corners 160 depending on IC structure 102 (FIG. 1) layout, and may be outwardly projecting or inwardly projecting. In any event, corner 160 may include first and second conductive structures 110, 112 (spine 132, 136) at a corresponding corner of the IC structure stepped in such a fashion as to create a plurality of parallel sections 162 between first and second conductive structures 110, 122 (some run horizontally on page and some run vertically on page). At least one of plurality of parallel sections 162 includes at least a portion of a set of interdigitating conductive elements 120F-K (6 as shown). While sets of interdigitating conductive elements 120F-K have been shown employing the FIG. 2 arrangement, it is emphasized that any embodiment(s) of interdigitating conductive elements described herein may be employed in corner 160. Further, while each parallel section 162 has been shown to include a respective set of interdigitating conductive elements 120F-K, it is emphasized that one or more parallel sections 162 may be devoid of interdigitating conductive elements. While parallel sections 162 have been shown as perpendicular, they may be set at other angles, so long as the end parallel sections 162E mate with the otherwise parallel conductive structures 110, 112 extending along perimeter 108.

Figure 6:
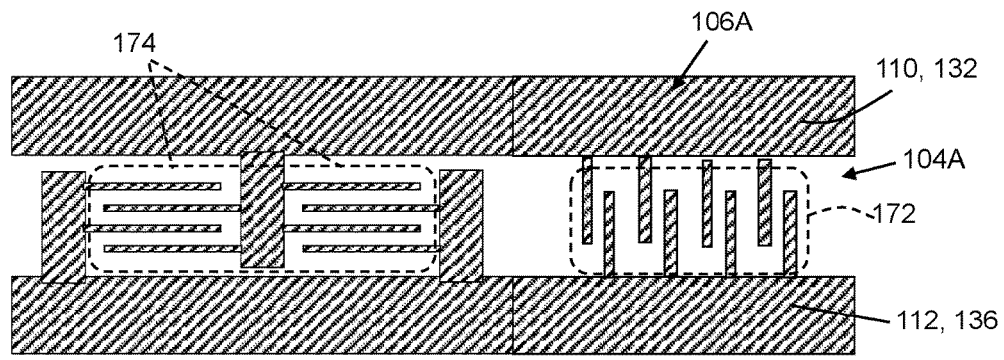
FIGS. 6 and 7 show enlarged top views of two different sensor layers.
Figure 7:
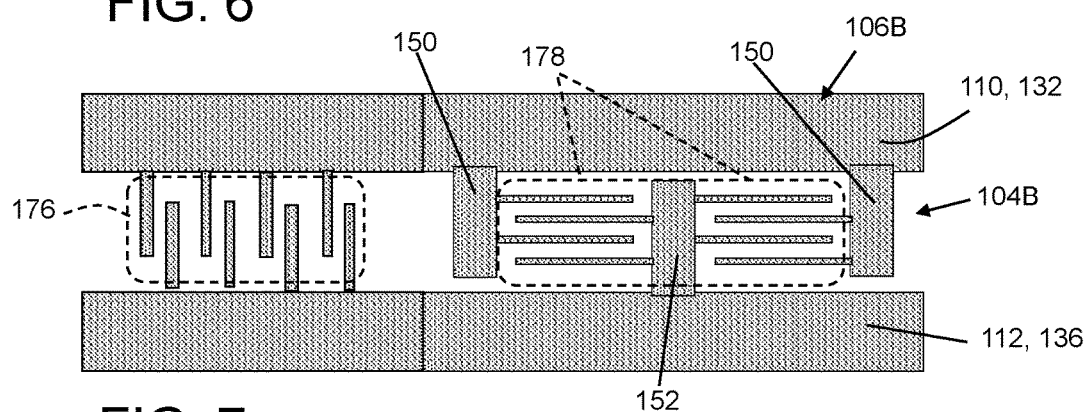

FIGS. 2-5 show interdigitating conductive element arrangements within a single sensor layer 106 (FIG. 1). As noted, sensor 100 however can extend between layers 104 (FIG. 1) of IC structure 102 (FIG. 1). Each sensor layer 106 can be identical to other sensor layer(s) 106, i.e., have the same arrangement of conductive structures and sets of interdigitating conductive elements. In another embodiment however two or more sensor layers 106 may have different arrangements. FIGS. 6 and 7 show enlarged top views of two different sensor layers 106A, 106B. Here, as shown in FIG. 6, a first sensor layer 106A within a first layer 104A of IC structure 102 (FIG. 1) may include a first set of interdigitating conductive elements (actually two sets shown: 172 and 174) having a first arrangement. In the FIG. 6 example, first sensor layer 106A uses a set of conductive elements 172 similar to those in FIG. 2 or 3, and a set of conductive elements 174 similar to those in FIG. 4 to the left of set 172. As shown in FIG. 7, a second sensor layer 106B within a second layer 104B of IC structure 102 (FIG. 1) different than the first layer (above or below in FIG. 1) may have a different arrangement of conductive elements. That is, second sensor layer 106B includes a second set of interdigitating conductive elements (actually two sets 176, 178 shown) having a second arrangement different than the first arrangement of FIG. 6. In the FIG. 7 example, second sensor layer 106B uses set of conductive elements 176 similar to those in FIG. 2 or 3, and set of conductive elements 178 similar to those in FIG. 4 to the left of set 178.

Figure 8:
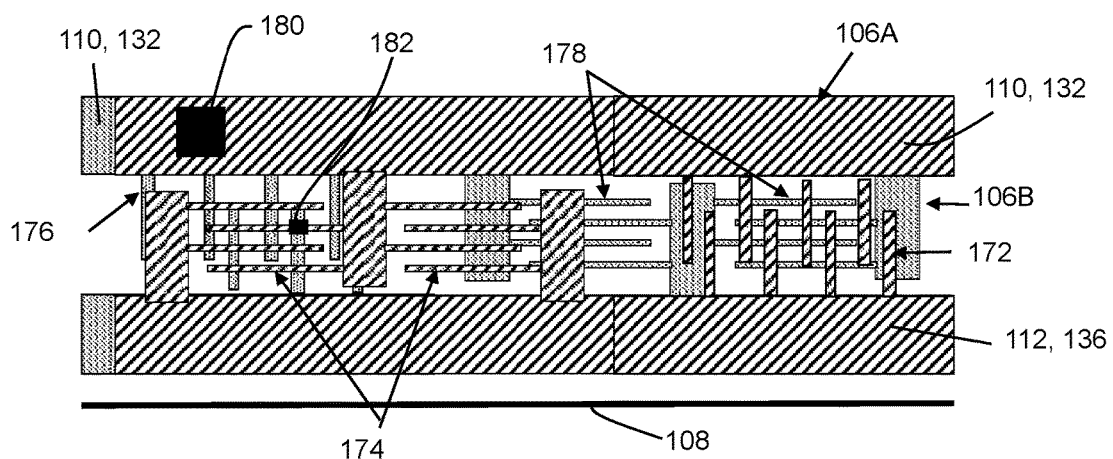
FIG. 8 shows an enlarged top view of the interposed different sensor layers of FIGS. 6 and 7.

FIG. 8 shows an enlarged top view of the interposed different sensor layers 106A, 106B of FIGS. 6 and 7. Here, first sensor layer 106A is within a first layer 104A (FIG. 6) of IC structure 102, and second sensor layer 106B is within a second layer 104B (FIG. 7) of IC structure 102 different than the first layer (below as shown). Each sensor layer 106A, 106B may be coupled to at least one other sensor layer using any appropriate via. That is, first sensor layer 106A in first layer 104A (FIG. 6) of IC structure 102 (FIG. 1) is electrically coupled by a via 180 and/or 182 to second sensor layer 106B in second layer 104B (FIG. 7) of IC structure 102 (FIG. 1) different than first layer 104A (FIG. 6) of the IC structure. As shown in the example of FIG. 8, at least one via 180 may couple conductive structures 110, 110 of each layer 106A, 106B. Alternatively, or in addition thereto, as also shown in FIG. 8, a conductive element (of set 174) in first sensor layer 106A may be electrically coupled to a conductive element (of set 176) in second sensor layer 106B by a via 182. Connection sensor layers 106A and layer saves input/outputs (I/Os) in products. While one via 180 or 182 have been illustrated, it is emphasized that any number of vias may be employed necessary to create the desired resistance. Also, while two sensor layers 106A, 106B have been shown in FIGS. 6-8, it is emphasized that sensor 100 (FIG. 1) may include any number of sensor layers 106 within any respective number of layers 104 of the IC structure. Alternatively, sensor layer 106A and sensor layer 106B can be standalone layers without vias connecting them. In this case interlevel (in addition to intralevel) leakage and bias, as well as resistance of each individual layer, can be performed. Thus, if a chip fails, one can know which layer(s) is/are failing.

Figure 9:
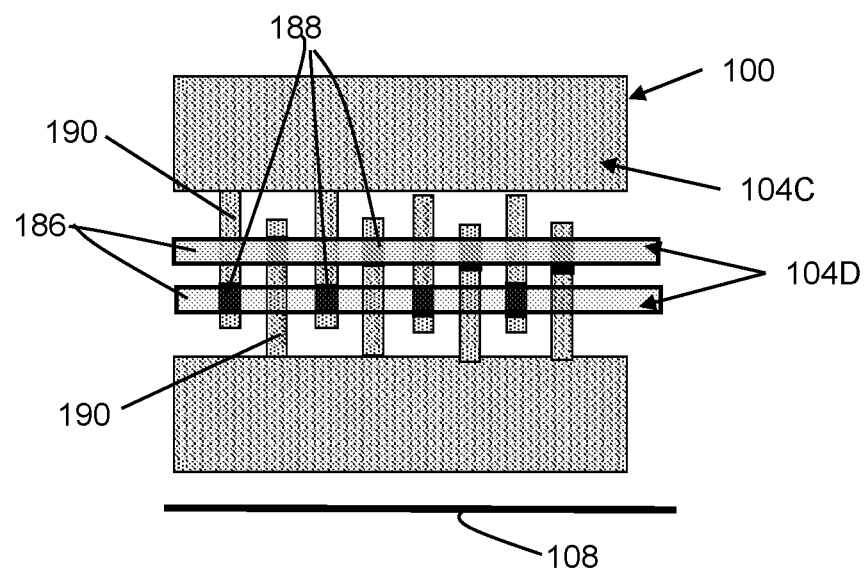
FIG. 9 shows an enlarged top view of the sensor as noted in FIG. 1 including vias according to embodiments of the disclosure.
Figure 10:
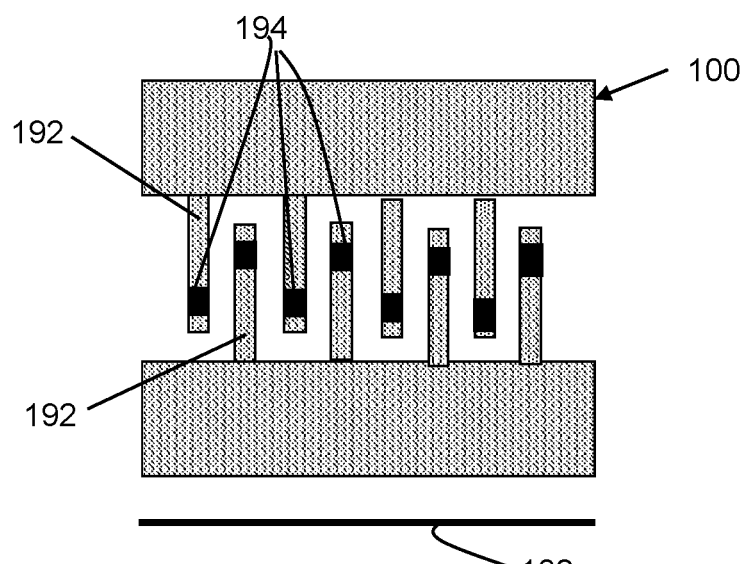
FIG. 10 shows an enlarged top view of the sensor as noted in FIG. 1 including vias according to embodiments of the disclosure.

FIG. 9 shows an enlarged top view of the sensor as noted in FIG. 1 according to alternative embodiments of the disclosure. In FIG. 9, sensor 100 couples to other conductive structure, e.g., wires, vias, active devices, etc., in other layers 104 of IC structure 102 (FIG. 1). In the example shown, sensor 100 is in a first (sensor) layer 104C of IC structure 102 (FIG. 1) and is coupled to other conductive structure, for example, wires 186, in another layer(s), e.g., layer 104D, of IC structure 102 (FIG. 1) by vias 188 that couple to conductive elements 190 thereof. FIG. 10 shows another alternative embodiment of sensor 100 in which at least one conductive element 192 includes a via 194 electrically coupled thereto, but via 194 does not couple to any other structure. That is, via 194 simply extends into an adjacent layer 104 (FIG. 1) of IC structure 102 (FIG. 1).

Figure 11:
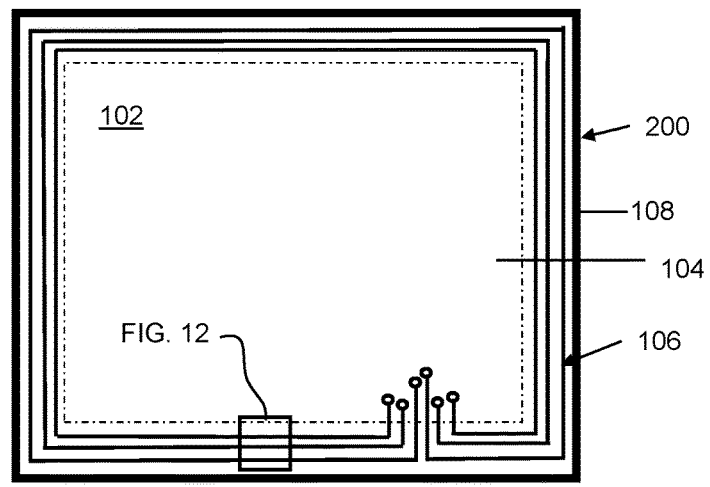
FIG. 11 shows a top view of a sensor for an IC structure according to another embodiment of the disclosure.
Figure 12:
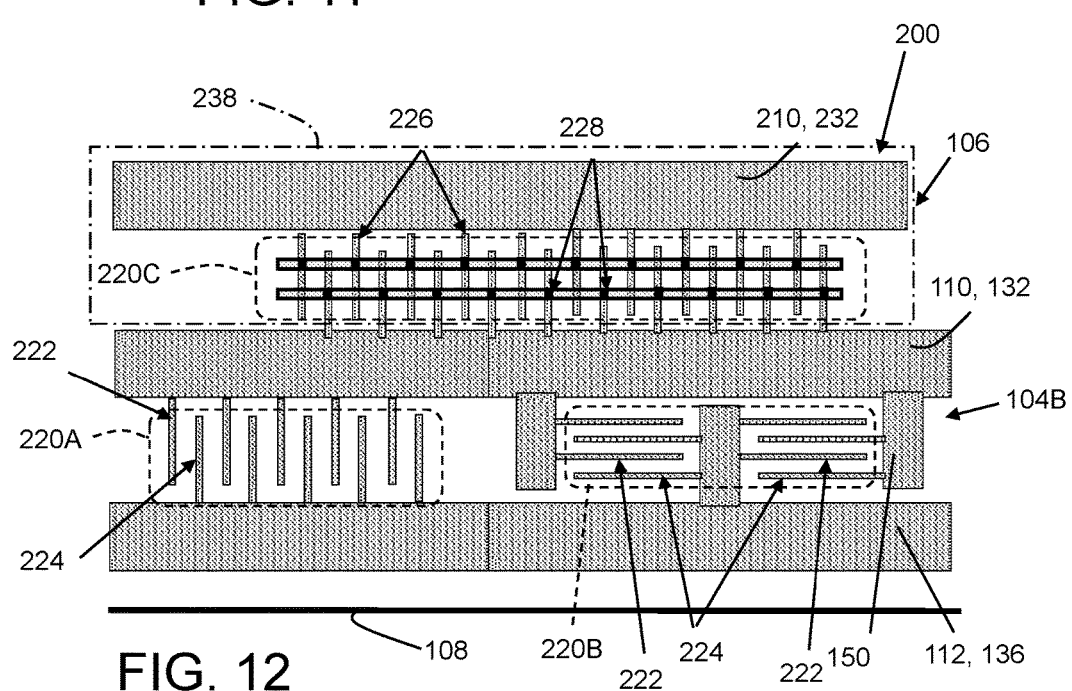
FIG. 12 shows an enlarged top view of the sensor as noted in FIG. 11 according to embodiments of the disclosure.

FIG. 11 shows a top view of a sensor 200 for IC structure 102 according to another embodiment of the disclosure, and FIG. 12 shows an enlarged top view of sensor 200 as noted in FIG. 11. In this embodiment, sensor 200 includes another conductive comb structure 238 (phantom box in FIG. 12) having a set of interdigitating conductive elements 220C. That is, sensor 200 includes an example of the sensor as described herein (example used from FIG. 7), but with a third conductive structure 210 (spine 232) disposed parallel to a selected one of first conductive structure 110 (spine 132)(as shown) and second conductive structure 112 (spine 136). Similar, to conductive structures 110, 112, third conductive structure 210 is proximate perimeter 108 of IC structure 102 (FIG. 1). Third conductive structure 210 may run parallel to first and second conductive structures 110, 112. Here, the interdigitating conductive elements include, in addition to first and second pluralities of interdigitating conductive elements 222, 224 (within 2 sets 220A, 220B), a third plurality of conductive elements 226 electrically coupled to third conductive structure 210. Third plurality of conductive elements 226 interdigitating with a fourth plurality of conductive elements 228 electrically coupled to the selected one of first conductive structure 110 (as shown) and second conductive structure 112. Conductive elements 226 and 228 are shown in the form of the example from FIG. 9 (i.e., coupling to other conductive structure in other IC layers), but any embodiment of interdigitating conductive elements described herein can be employed with the new conductive comb structure 238. While three conductive structures 110, 112, 210 have been illustrated, four or more with sets of interdigitating conductive elements may also be employed.

While conductive structures 110, 112, 210 and conductive elements 122, 124, etc., have been illustrated herein as straight lines, it is understood that they may take a variety of alternative shapes within the teachings of the disclosure.

Sensor 100, 200 described herein can be built using minimum ground rule line dimensions and spacing along a perimeter of an IC structure. Consequently, sensor 100, 200 does not require enlarged widths to maintain lower resistance, as is conventional. Sensor 100, 200 also allows IC package integrity monitoring at time zero and in real time over a product lifetime. The various embodiments described herein and otherwise possible according to the teachings of the disclosure enable a high level of customization for a particular IC structure and/or application.

The resulting IC structure (and/or sensor) described herein can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip may be then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A sensor for an integrated circuit (IC) structure, the sensor comprising:
   a sensor layer in a layer of the IC structure, the sensor layer including:
      a first conductive structure disposed proximate a perimeter of the IC structure;
      a second conductive structure disposed parallel to the first conductive structure and proximate the perimeter of the IC structure; and
      a set of interdigitating conductive elements including a first plurality of conductive elements electrically coupled to the first conductive structure interdigitating with a second plurality of conductive elements electrically coupled to the second conductive structure, the first plurality of conductive elements including a first conductive element having a first length, the second plurality of conductive elements including a second conductive element adjacent to the first conductive element and having a second length, wherein a sum of the first length and the second length is greater than a separation distance between the first and second conductive structures.

2. The sensor of claim 1, wherein the first plurality of conductive elements extends perpendicularly from the first conductive structure and the second plurality of conductive elements extends perpendicularly from the second conductive structure.

3. The sensor of claim 1, wherein a corner of the first and second conductive structures at a corresponding corner of the IC structure is stepped creating a plurality of parallel sections between the first and second conductive structures, wherein at least one of the plurality of parallel sections includes at least a portion of the set of interdigitating conductive elements.

4. The sensor of claim 3, wherein each parallel section includes a respective set of interdigitating conductive elements.

5. The sensor of claim 1, wherein the set of interdigitating conductive elements includes at least two sets of interdigitating conductive elements, the at least two sets of interdigitating conductive elements having at least one of: different sized conductive elements, different spacing between conductive elements and different density of conductive elements.

6. The sensor of claim 1, further comprising:
   a first intermediate conductive member extending perpendicularly from and electrically coupled to the first conductive structure, and wherein the first plurality of conductive elements extends perpendicularly from the first intermediate conductive structure; and
   a second intermediate conductive member extending perpendicularly from and electrically coupled to the second conductive structure, and wherein the second plurality of conductive elements extends perpendicularly from the second intermediate conductive structure.

7. The sensor of claim 1, wherein the sensor layer in the layer of the IC structure includes:

a first sensor layer within a first layer of the IC structure, wherein the set of interdigitating conductive elements includes a first set of interdigitating conductive elements in the first layer having a first arrangement, and a second sensor layer within a second layer of the IC structure different than the first layer, wherein the set of interdigitating conductive elements includes a second set of interdigitating conductive elements in the second sensor layer having a second arrangement different than the first arrangement, such that the second set of interdigitating conductive elements in the second sensor layer are oriented substantially perpendicularly relative to the first set of interdigitating conductive elements, wherein the second set of interdigitating conductive elements overlies the first set of interdigitating conductive elements.

8. The sensor of claim 7, further comprising at least one via coupling a conductive element in the first sensor layer to a conductive element in the second sensor layer.

9. The sensor of claim 1, wherein at least one conductive element includes a via electrically coupled thereto.

10. The sensor of claim 9, wherein the sensor layer within the layer of the IC structure includes a first sensor layer in a first layer of the IC structure electrically coupled by the via to a second sensor layer in a second layer of the IC structure different than the first layer of the IC structure.

11. The sensor of claim 1, further comprising a third conductive structure disposed parallel to a selected one of the first conductive structure and the second conductive structure, the third conductive structure proximate the perimeter of the IC structure; and wherein the set of interdigitating conductive elements further includes a third plurality of conductive elements electrically coupled to the third conductive structure interdigitating with a fourth plurality of conductive elements electrically coupled to the selected one of the first conductive structure and the second conductive structure.

12. The sensor of claim 1, further comprising a terminal coupled to each end of the first and second conductive structures.

13. The sensor of claim 1, wherein the first conductive structure and the second conductive structure are each individually wider than any conductive element in the set of interdigitated conductive elements.

14. The sensor of claim 1, wherein a spacing between adjacent interdigitated conductive elements is no greater than a width of each individual conductive element.

15. The sensor of claim 1, wherein the first conductive structure and the first plurality of conductive elements are configured in a comb arrangement, and the second conductive structure and the second plurality of conductive elements are configured in a comb arrangement.

16. The sensor of claim 1, wherein the first and second conductive element each extend beyond a midpoint between the first and second conductive structures.

17. A sensor for an integrated circuit (IC) structure, the sensor comprising:

a sensor layer in a layer of the IC structure, the sensor layer including:

a first conductive comb structure disposed proximate a perimeter of the IC structure and having a first conductive spine and a first plurality of conductive elements electrically coupled to the first conductive spine, the first plurality of conductive elements including a first conductive element having a first length; and a second conductive comb structure disposed proximate the perimeter of the IC structure and having a second conductive spine and a second plurality of conductive elements electrically coupled to the second conductive spine, the second plurality of conductive elements including a second conductive element adjacent to the first conductive element and having a second length, wherein a sum of the first length and the second length is greater than a separation distance between the first and second conductive structures, wherein the first plurality of conductive elements interdigitate with the second plurality of conductive elements, and wherein the sensor layer within the layer of the IC structure includes a first sensor layer in a first layer of the IC structure electrically coupled by a via to a second sensor layer in a second layer of the IC structure different than the first layer of the IC structure.

18. The sensor of claim 17, wherein the first conductive spine and the second conductive spine are each individually wider than any conductive element.

19. The sensor of claim 17, wherein a spacing between adjacent interdigitated conductive elements is no greater than a width of each individual conductive spine.

* * * * *